(12) United States Patent
Jong et al.

(10) Patent No.: US 8,268,532 B2
(45) Date of Patent: Sep. 18, 2012

(54) METHOD FOR FORMING MICROSCOPIC STRUCTURES ON A SUBSTRATE

(75) Inventors: Alan Frank De Jong, Eindhoven (NL); Johannes Jacobus Lambertus Mulders, Eindhoven (NL); Wilhelmus Mathijs Marie Kessels, Tilburg (NL); Adriaan Jacobus Martinus Mackus, Eindhoven (NL)

(73) Assignee: FEI Company, Hillsboro, OR (US)

( * ) Notice: Subject to any disclaimer, the term of this patent is extended or adjusted under 35 U.S.C. 154(b) by 343 days.

(21) Appl. No.: 12/642,298

(22) Filed: Dec. 18, 2009

(65) Prior Publication Data

US 2010/0159370 A1    Jun. 24, 2010

(30) Foreign Application Priority Data

Dec. 19, 2008  (EP) .................................. 08172251

(51) Int. Cl.
*G03C 5/00* (2006.01)
(52) U.S. Cl. ........ 430/296; 430/313; 430/314; 430/315; 430/942; 430/966
(58) Field of Classification Search .................. 430/296, 430/313, 315, 942, 966, 314
See application file for complete search history.

(56) References Cited

U.S. PATENT DOCUMENTS

| | | | |
|---|---|---|---|
| 5,639,699 A | 6/1997 | Nakamura et al. | |
| 5,733,369 A | 3/1998 | Yonehara et al. | |
| 6,399,516 B1 | 6/2002 | Ayon | |
| 6,599,361 B2 | 7/2003 | Tang et al. | |
| 6,838,380 B2 | 1/2005 | Bassom et al. | |
| 7,118,657 B2 | 10/2006 | Golovchenko et al. | |
| 7,242,013 B2 | 7/2007 | Fukuda et al. | |
| 7,303,631 B2 | 12/2007 | Conley, Jr. et al. | |
| 7,453,072 B2 | 11/2008 | Fukuda et al. | |
| 7,674,706 B2 | 3/2010 | Gu et al. | |
| 8,163,641 B2 | 4/2012 | Gu et al. | |
| 2008/0088831 A1 | 4/2008 | Mulders et al. | |
| 2009/0227093 A1 | 9/2009 | Schaff et al. | |
| 2010/0032302 A1 | 2/2010 | Holtermann et al. | |

OTHER PUBLICATIONS

Biercuk, M.J., et al., 'Low-Temperature Atomic-Layer-Deposition Lift-Off Method for Microelectronic and Nanoelectronic Applications,' Applied Physics Letters, Sep. 22, 2003, pp. 2405-2407, vol. 83, No. 12.

Guise, Olivier, et al., 'Patterning of Sub-10-nm Ge Islands on Si(100) by Directed Self-Assembly,' Applied Physics Letters, 2005, 3 pgs, vol. 87.

*Primary Examiner* — Christopher Young
(74) *Attorney, Agent, or Firm* — Scheinberg & Associates, PC; Michael O. Scheinberg; John B. Kelly

(57) ABSTRACT

The invention relates to a method for forming microscopic structures. By scanning a focused particle beam over a substrate in the presence of a precursor fluid, a patterned seed layer is formed. By now growing this layer with Atomic Layer Deposition or Chemical Vapor Deposition, a high quality layer can be grown.

Figure 1A:
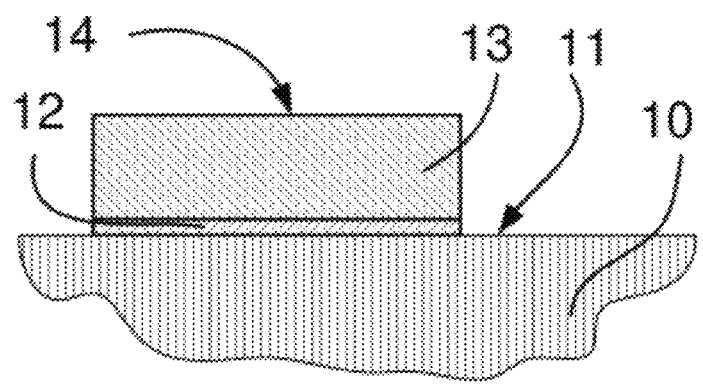

An advantage of this method is that forming the seed layer takes relatively little time, as only a very thin layer needs to be deposited.

12 Claims, 4 Drawing Sheets

METHOD FOR FORMING MICROSCOPIC STRUCTURES ON A SUBSTRATE

The invention relates to a method for forming a microscopic structure on a substrate, the method comprising: providing a substrate with a surface, forming a patterned seed layer with a desired shape on the surface of the substrate, and thickening the patterned seed layer in such a manner that a structure with a surface substantially parallel to the surface of the substrate is formed.

This method is disclosed in "Low-temperature atomic-layer-deposition lift-off method for microelectronic and nanoelectronic applications", M. J. Biercuk et al., Appl. Phys. Lett., Vol. 83, No. 12, September 2003, pp. 2405-2407, DOI: 10.1063/1.612904.

The aforementioned method discloses the growth of patterned dielectric films on a substrate. The substrate is a piece of polished silicon wafer with 1 μm thick layer of thermally grown oxide. On the substrate a resist layer is spun. A pattern is formed in the resist by photolithographic techniques or direct e-beam writing in the resist and subsequent development of the resist. This leaves part of the substrate exposed, while the rest of the substrate is masked by a resist layer with a thickness of approximately 350 nm. A first layer of a precursor fluid is then deposited on the exposed part of the substrate, thereby forming a patterned seed layer. Thereafter Atomic Layer Deposition (ALD) is used to thicken the layer by the cyclic admission of fluids to a typical thickness of the resulting structure ranged from 2.5 to 100 nm. For uniform structure thickness and purity a nitrogen purge step was inserted between each ALD fluid admission step.

The resulting thickened layer is e.g. aluminium oxide ($Al_2O_3$), zirconium oxide ($ZrO_2$) or hafnium oxide ($HfO_2$).

It is noted that a seed layer on which a structure can be grown with e.g. ALD is also often referred to as a catalyst layer.

A disadvantage of said method is that the minimum feature size of the patterned structure is limited by the photolithographic processes and subsequent etching.

Another disadvantage of said method is the use of the photolithographic process, and the large number of steps implied by it.

There is a need for a method of forming structures with smaller dimensions than available with lithographic techniques.

For this purpose the method according to the invention is characterized in that forming the patterned layer comprises irradiating the substrate with a focused particle beam in the presence of a precursor fluid or an etching fluid.

The invention is based on the concept of directly forming a patterned seed layer by either milling a uniform seed layer with a focused beam or depositing the seed layer with beam induced deposition, e.g. Electron Beam Induced Deposition (EBID) or Ion Beam Induced Deposition (IBID), or with a focused beam of light.

It is remarked that in this context milling refers to the removal of material with a focused ion beam, and includes beam assisted etching using an etchant fluid.

It is further noted that the use of a charged particle beam is preferred for forming microscopic structures with dimensions below, for example, 1 μm.

As known to the person skilled in the art such milling and deposition techniques with charged particle beams are capable of resolutions of between 1-10 nm. However, direct milling or deposition for large volumes is a time consuming process, and therefore milling and deposition is typically expressed in cubic microns. A typical milling speed with a focused ion beam is, for example, 0.1 $\mu m^3$/s, while the typical deposition speed for EBID is typically 1000× less. Therefore these techniques are not suited for building nanostructures with a volume in excess of, for example, 1 $\mu m^3$ using deposition and, for example, 100 $\mu m^3$ using milling.

Inventors realized that the time needed for depositing material with EBID or IBID is proportional to the volume of the material deposited Likewise, the time needed for milling is proportional to the amount of material milled. Inventors then realized that, by only forming a thin patterned seed layer by direct milling or deposition, and then thickening the patterned seed layer with e.g. ALD, a high resolution process with relative high grow rate results. The time consuming aspect of direct milling or deposition is limited to the milling or deposition of a very thin layer (that may be as little as one atomic monolayer), while the bulk of the material is deposited in a parallel fashion by growing the whole seed layer. It therefore combines the high resolution of milling or depositing with a focused particle beam with the growth rate of e.g. example ALD, and eliminates the process steps associated with lithography.

It is noted that the seed layer may comprise a metal, but may comprise any material that can induce growth.

It is mentioned that U.S. Pat. No. 7,303,631 discloses the growth of ZnO nanowires on a ZnO seed layer. The disclosed method differs from the invention in that, as nanowires are formed, the form of the patterned seed layer is not preserved and the top of the structure is not substantially parallel to the surface.

In an embodiment of the method according to the invention the thickening comprises Atomic Layer Deposition (ALD).

As known to the person skilled in the art, although the seed layer may be (and often is) impure, the material deposited with ALD is of high purity. Also ALD offers a high control of the growth rate and the resultant layer will show a very uniform thickness.

It is noted that ALD may include an intermediate step of admitting a purge fluid to improve the purity and thickness control of the ALD deposition, as mentioned in e.g. the earlier mentioned "Low-temperature atomic-layer-deposition lift-off method for microelectronic and nanoelectronic applications".

In another embodiment of the method according to the invention the thickening comprises Chemical Vapour Deposition (CVD), Plasma Enhanced Chemical Vapour Deposition (PECVD), Metalorganic Chemical Vapour Deposition (MOCVD), or Molecular Beam Epitaxy (MBE).

The advantage of these methods, all known to the person skilled in the art, is their high growth rate when compared to e.g. ALD, albeit that the growth rate is less controlled and thus the thickness is less controlled. A disadvantage of these methods when compared to ALD is that often higher temperatures of the substrate are needed.

In yet another embodiment of the method according to the invention irradiating the substrate with a focused beam comprises imaging a mask onto the substrate with the help of a lens.

Optical and particle-optical apparatus imaging a mask onto a substrate such as a wafer are well-known to the person skilled in the art. Two distinct versions exist: the apparatus in which the mask is placed in close proximity to the wafer, and the version in which the mask is images onto the substrate by a lens. The version in which the mask is placed in close proximity to the substrate is often used in e.g. X-ray lithography. The version in which the mask is imaged is often used with optical lithography and e-beam lithography, in which the mask is demagnified several times, enabling the use of a mask with larger dimensions than the dimensions realized on the substrate. Both versions show a high throughput when compared to the systems in which a thin pencil is scanned over the wafer. However, their flexibility is limited when compared to the scanning version.

In yet another embodiment of the method according to the invention irradiating the substrate with a focused beam comprises scanning the focused beam over the substrate, where the focal diameter of the focused beam is smaller than the largest dimension of the desired shape.

In this method a focused beam, such as a beam of electrons or ions, is scanned over the substrate to form the desired shape. Hereby only part of the substrate can be exposed to the particles, while other parts of the substrate are not irradiated. This method is well-known to the person skilled in the art of e-beam lithography.

It is noted that writing an array of dots on a substrate is disclosed in "Patterning of sub-10-nm Ge islands on Si(1000) by direct self-assembly", O. Guise et al., Appl. Phys. Letters 87, 171902 (2005), page 1-3. This paper discloses that an array of carbon dots is deposited on a silicon wafer. The carbon dots are treated with ozone, resulting in smaller dots and a cleaner surface between the dots (elimination of hydrocarbons). A heat treatment at 1250 K results in the formation of SiC nucleation sites, after which Ge is deposited to form patterned islands. This method differs from the method according to the invention in that the beam diameter with which the carbon dots are written is not smaller than the carbon dots themselves, and that the structures formed on the SiC nucleation sites have the form of cones instead of structures with a surface parallel to the substrate.

In another embodiment of the method according to the invention a homogeneous seed layer is deposited on the substrate prior to irradiating the substrate with a focused beam, and the focused beam mills a pattern in the homogeneous seed layer so as to form the patterned seed layer.

By milling (or by beam assisted etching) a pattern in a previously deposited seed layer a patterned seed layer with high edge resolution can be formed. In this context milling and etching includes fluid assisted etching.

In another embodiment of the method according to the invention a second patterned seed layer is formed after thickening the patterned seed layer, and subsequently the thickened patterned seed layer and the newly formed second patterned seed layer are thickened.

By changing the patterned seed during the process, the area that is thickened is changed. As a result part of the microscopic structure will have another thickness than the other part, due to the different thickening time. Thereby a 3D structure with different thicknesses is formed.

In another embodiment of the method according to the invention, after thickening the patterned seed layer, part of the surface of the structure is inhibited so that said inhibited part cannot be further thickened, after which the remaining part of the structure is further thickened.

Here the patterned layer is changed by inhibiting part of the surface. As a result this inhibited part will not thicken further, and a 3D structure with different thicknesses is formed.

In another embodiment of the method according to the invention a second patterned seed layer is formed after forming the structure, after which the second patterned seed layer is thickened with another material.

By changing the material grown, a 3D structure with layers of different materials can be formed. The different materials can be layered on top of each other, or they can be adjacent to each other or they can be overlapping, depending on where the second seed layer is formed In another embodiment of the method according to the invention forming the pattern and thickening the patterned seed layer is done in the same apparatus.

By performing the steps of forming the seed layer and thickening the layer in the same instrument, there is no need to expose the substrate and the seed layer to atmosphere, thereby avoiding contamination, poisoning and/or oxidation of the layers between these steps.

In an aspect of the invention an apparatus with a column for producing a focused beam, wherein said beam is a beam of light, a beam of ions or a beam of electrons, the apparatus equipped with a vacuum chamber in which a substrate can be mounted on a substrate holder, said substrate holder equipped to be heated, the apparatus equipped with a controller, the controller equipped to control the apparatus to irradiate the substrate with the focused particle beam forming a predetermined pattern, the controller equipped to control the apparatus to admit precursor and/or etchant fluids to the vacuum chamber, is characterized in that the controller is further equipped to control the apparatus to admit fluids to the specimen area in a repetitive manner.

In this aspect an apparatus such as, for example, a SEM, FIB and/or an instrument with both an electron and an ion column, capable of forming a pattern on the substrate, and equipped with a heating stage, is further equipped with software for performing ALD.

In an embodiment of the apparatus according to the invention the apparatus is further equipped with a thickness measurement system.

By equipping the apparatus with a thickness measurement system, the thickness of the structures can be determined. By comparing this with a predetermined thickness, this measurement can be used to end the thickening process.

In a further embodiment of the apparatus according to the invention the thickness measurement system uses the detection of X-rays generated in the substrate as a result of an impinging focused particle beam.

As both the dimensions of the structures and the thicknesses to be measured are often too small for reliable measurement with optical means, X-ray detection can be used. In this method, known per se, a (focused) beam of electrons impinges on the substrate where the structure resides. As a result characteristic X-rays are generated both of the top layer (the material of the deposited material) as from the substrate (due to the penetrating power of the electrons). The material of the structure absorbs X-rays from the underlying substrate. By now comparing the ratio of characteristic radiation and/or the intensity thereof with, for example, a calibration table, the thickness of the layer can be determined.

It is noted that the focused beam may be the beam used for depositing the seed layer, but may be a different beam.

Figure 1B:
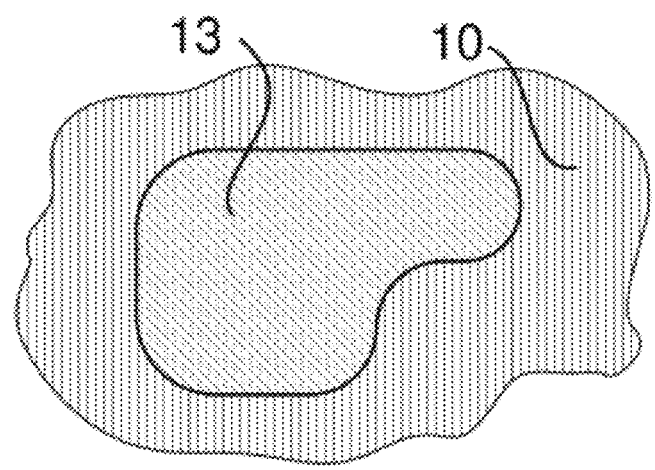
Figure 2:
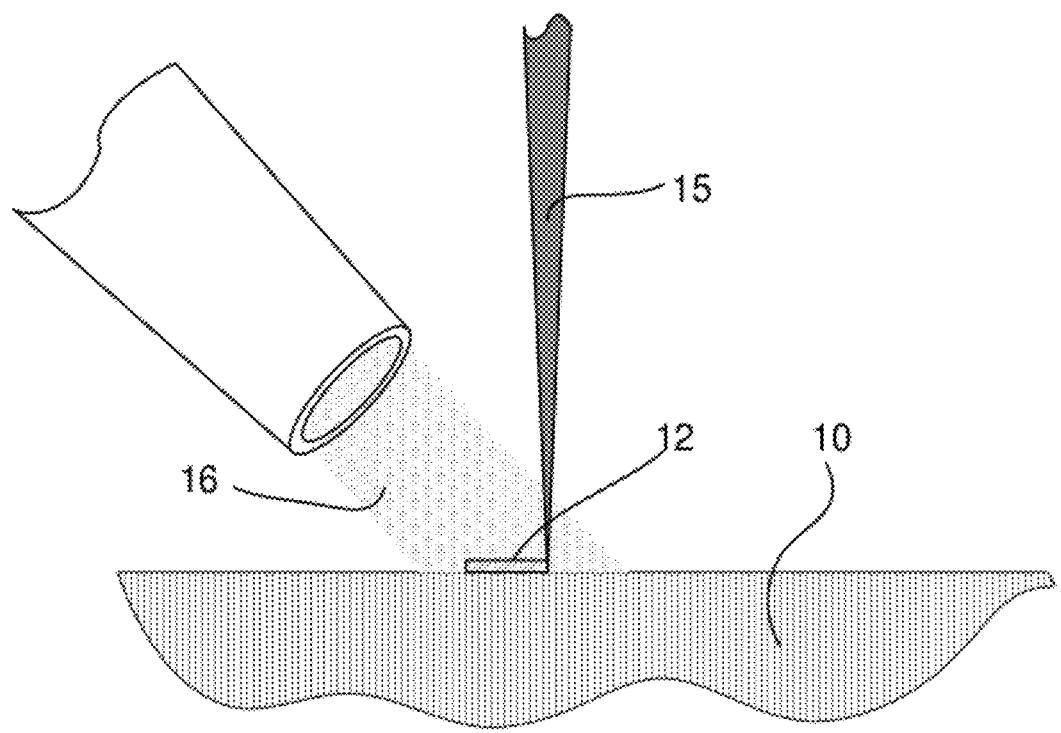
Figure 3:
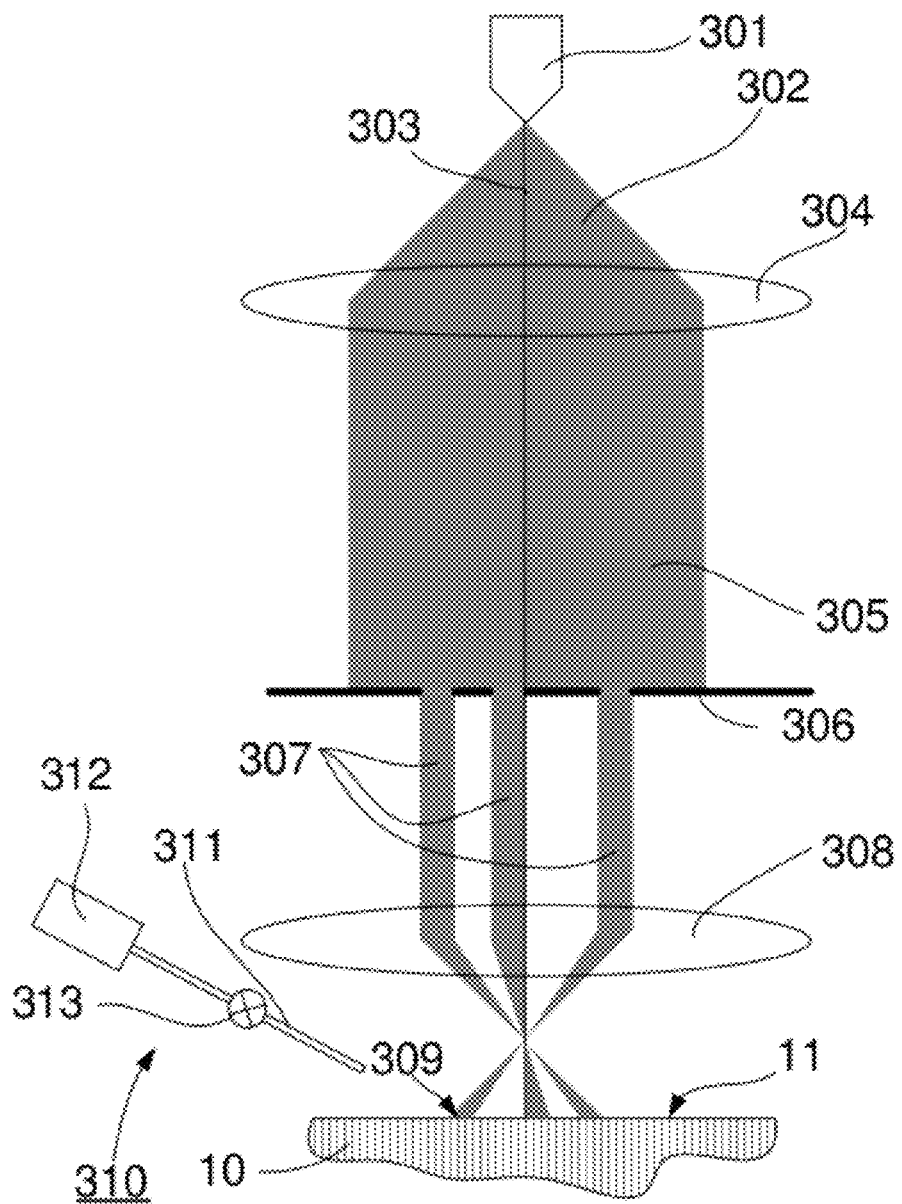
Figure 4:
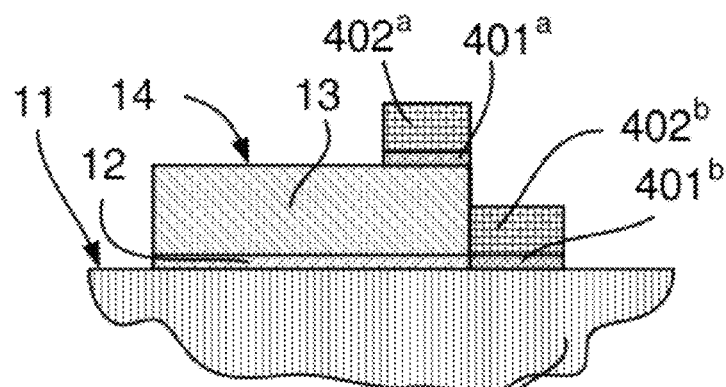
Figure 5:
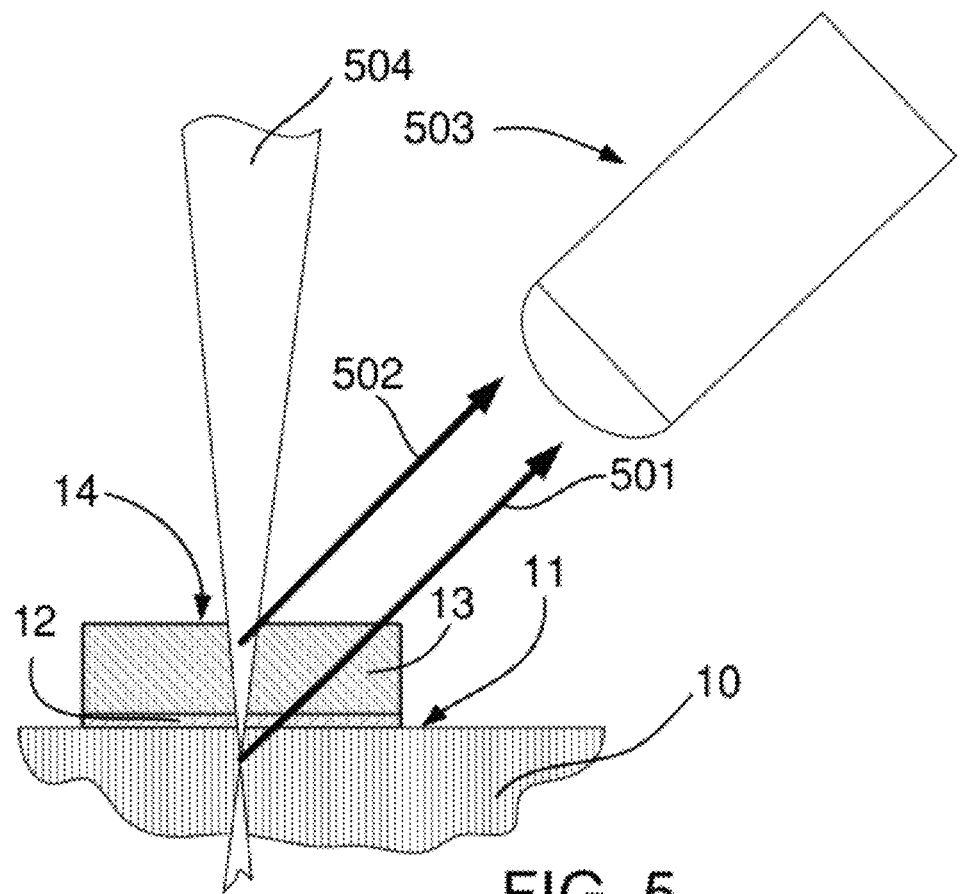

The invention is now described with reference to figures in which the identical reference numerals denote corresponding elements. Here:

FIGS. 1A and 1B schematically show a substrate with a microscopic structure thereon, FIG. 2 schematically depicts a substrate on which a seed layer is formed. shows, FIG. 3 schematically depicts a particle-optical apparatus in which a mask is imaged onto a substrate, FIG. 4 schematically shows a substrate with a microscopic structure, on which a further structure is built, and FIG. 5 schematically depicts a layer thickness measurement system to be used for measuring the layer thickness deposited by the method according to the invention.

FIG. 1A schematically shows a cut-through of a substrate with a microscopic structure thereon, while FIG. 1B shows the same substrate as seen from the side where the microscopic structure is grown on the substrate.

FIGS. 1A and 1B shows a substrate 10 with a surface 11, on which a seed layer 12 was deposited with EBID or IBID. The seed layer is then thickened with material 13 using, for example, ALD or CVD, the material shows a surface 14 that is substantially parallel to the surface of the substrate.
Substrate 10 may be a semiconductor substrate, such as a wafer or a chip, showing surfaces of for example silicon oxide, silicon nitride, or aluminium oxide. However, also other materials may be used as a substrate, such as diamond or any other material on which a seed layer may be deposited.

FIG. 2 schematically depicts a substrate on which a seed layer is formed.

FIG. 2 shows a substrate 10 on which a focused particle beam 15, such as an electron beam or an ion beam, is focused. A jet of precursor fluid 16 is directed to the substrate. As a result a seed layer 12 is formed on the substrate where the focused particle beam impinges on the substrate.

Inventors experimented successfully with a silicon wafer with a $SiO_2$ surface, on which a seed layer of Platinum was deposited by exposing the precursor Me Cp Pt $Me_3$ [short for: methylcyclopentadienylplatinum (IV) trimethyl] to a focused beam of gallium ions.

It is noted that the seed layer may be a compound of the material to be grown on top of the seed layer, but that it is also known to use other materials. So a platinum seed layer and ruthenium layers may be built on top of each other.

FIG. 3 schematically depicts a particle-optical apparatus in which a mask is imaged onto a substrate.

FIG. 3 shows a particle source 301, such as an electron source or an ion source, for producing a beam of particles 302 round particle-optical axis 303. The beam of particles is formed in a parallel beam 305 by condenser lens 304. The parallel beam irradiates a mask 306, which shows parts that are transparent to the beam 305 and parts that are not transparent to the beam.
An objective lens 308 images the mask onto the surface 11 of the substrate 10. At position 309, where the substrate is irradiated by particles, a seed layer may be deposited, or at this position the previously uniform seed layer may be milled or etched. The precursor or etchant fluid necessary for the deposition or milling is directed to the substrate by a Gas Injection System (GIS) 310. A nozzle 311 directs the fluid, coming from a canister 312, to the part of the substrate that may be irradiated. The amount of fluid supplied is regulated by a valve 313, which is preferably under control of a controller.

It is remarked that the apparatus may be equipped with other GIS'-s to cyclically admit fluids to the substrate so as to perform ALD.

It is further remarked that the transparent parts in the mask may be cut-outs, but may also be thin foils, such as 50 nm thick foils of $SiN_3$, $SiO_2$, said foils being transparent to electrons with a high energy, such as 100 keV.

It is noted that as an alternative to this projection method and the earlier mentioned scanning of a focused beam, also multiple beam instruments can be used to improve the throughput. Such instruments are known per se.

FIG. 4 schematically shows a substrate with a microscopic structure, on which a further structure is built.

FIG. 4 can be thought to be derived from FIG. 1A. FIG. 4 shows a substrate 10 on which a first seed layer 12 is deposited. On this first seed layer a first material 13 is deposited, either by ALD or by another deposition technique, such as CVD. After depositing said first material 13 on the first seed layer, a second seed layer 401*a*, 401*b* is deposited. In this example part 401*b* of the second seed layer is deposited on the substrate and part 401*a* of the second seed layer is deposited on the already deposited first material 13. Thereafter a second material 402*a*, 402*b* is deposited on the second seed layer. It is remarked that this second material may have the same composition as the first material, but that it may be a different composition.

This method can be used to build 3D structures. By repeatedly using this method a 3D structure can be built in which a material of one kind is embedded in another type of material. For example: heavy metal structures can be embedded in materials with a low Z. This can be used to build, e.g. collimator structures or (Fresnel) lens structures for use with X-ray optics.

It is noted that a second layer can be deposited on the first material 13, said second layer inhibiting further growth of the structure on the area where this second layer is deposited. By then resuming thickening the layer on the area where the second layer is not deposited, a 3D structure is built.

It is further noted that, by slightly tilting the substrate with respect to the focused particle beam, the part of the second seed layer 401*a* on top of the already grown structure can be made continuous with the part of the second seed layer 401*b* on the substrate, or discontinuous.

FIG. 5 schematically depicts a layer thickness measurement system to be used for measuring the layer thickness deposited by the method according to the invention.

FIG. 5 can be thought to be derived from FIG. 1A. The surface 11 of a substrate 10 is partially covered with the patterned seed layer 12. On this seed layer material 13 is deposited, showing a surface 14.
This structure is now irradiated by a focused beam of electrons 504. As a result X-rays are generated both in the deposited material 13 (X-rays 502) and in the substrate (X-rays 501). Part of these X-rays are detected with an X-ray detector (503), such as an EDX detector. The X-rays generated in the substrate 10 are partly absorbed by the material through which it must travel to reach the detector, so for a thick layer less X-rays from the substrate will be detected. On the other hand, for a very thin deposited layer only little X-rays are generated in the deposited layer. The ratio of detected X-rays coming from the substrate and those coming from the deposited layer is therefore a function of the layer thickness. By comparing this ratio with a calibration table, the thickness of even very small structures can be determined with high precision.

It is noted that the ratio is also a function of the penetration power of the electrons, which is, as known to the person skilled in the art, a function of the energy of the electrons. Therefore the beam energy of the focused electron beam can be tailored for a thickness to be measured.

We claim as follows:

1. A method for forming a microscopic structure on a substrate, the method comprising:
   providing a substrate with a surface,
   forming a patterned seed layer with a desired shape on the surface of the substrate, and
   thickening the patterned seed layer vertically so as to essentially restrict the thickening to only the area above the patterned seed layer and in such a manner that a structure with a surface parallel to the surface of the substrate is formed and, such that
   forming the patterned seed layer comprises irradiating the substrate with a focused beam in the presence of a precursor fluid or an etching fluid.

2. The method of claim 1 in which the focused beam is a focused beam of light, a focused beam of ions or a focused beam of electrons.

3. The method of claim 1 in which the thickening comprises Atomic Layer Deposition (ALD).

4. The method of claim 1 in which the thickening comprises Chemical Vapour Deposition (CVD), Plasma Enhanced Chemical Vapour Deposition (PECVD), Metalorganic Chemical Vapour Deposition (MOCVD) or Molecular Beam Epitaxy (MBE).

5. The method of claim 1 in which irradiating the substrate with a focused beam comprises imaging a mask onto the substrate with the help of a lens.

6. The method of claim 1 in which irradiating the substrate with a focused beam comprises scanning the focused beam over the substrate, wherein the focal diameter of the focused beam is smaller than the largest dimension of the desired shape.

7. The method of claim 1 in which, prior to irradiating the substrate with a focused beam, a homogeneous seed layer is deposited on the substrate and the focused beam mills or etches a pattern in the homogeneous seed layer so as to form the patterned seed layer.

8. The method of claim 1 in which, after thickening the patterned seed layer, a second patterned seed layer is formed, and subsequently the thickened patterned seed layer and the newly formed second patterned seed layer are thickened.

9. The method of claim 1 in which, after thickening the patterned seed layer, part of the surface of the structure is inhibited so that said inhibited part cannot be further thickened, after which the remaining part of the structure is further thickened.

10. The method of claim 1 in which, after forming the structure, a second patterned seed layer is formed, after which the second patterned seed layer is thickened with another other material.

11. The method of claim 1 in which forming the patterned seed layer and thickening the patterned seed layer is done in the same apparatus.

12. The method of claim 1, further comprising irradiating a focused beam of electrons toward the structure and/or the substrate, and detecting resulting X-rays.

* * * * *